(12) United States Patent
Hague et al.

(10) Patent No.: US 8,575,647 B2
(45) Date of Patent: Nov. 5, 2013

(54) BIDIRECTIONAL SHOCKLEY DIODE WITH EXTENDED MESA

(75) Inventors: Yannick Hague, Mettray (FR); Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/326,686

(22) Filed: Dec. 15, 2011

(65) Prior Publication Data

US 2012/0161198 A1 Jun. 28, 2012

(30) Foreign Application Priority Data

Dec. 23, 2010 (FR) .................................. 10 61212

(51) Int. Cl.
*H01L 29/66* (2006.01)
(52) U.S. Cl.
USPC .................................. 257/109; 257/E29.337
(58) Field of Classification Search
CPC ...................................................... H01L 29/87
USPC .................. 257/109, 110, 111, 112, E29.337
See application file for complete search history.

(56) References Cited

U.S. PATENT DOCUMENTS

| 4,551,353 | A | 11/1985 | Hower et al. | |
|---|---|---|---|---|
| 5,479,031 | A | 12/1995 | Webb et al. | |
| 6,448,589 | B1 * | 9/2002 | Casey et al. | 257/173 |
| 2003/0209724 | A1 | 11/2003 | Casey et al. | |

FOREIGN PATENT DOCUMENTS

| EP | 0 018 730 A2 | 11/1980 |
|---|---|---|
| EP | 0 552 905 A1 | 7/1993 |
| EP | 0552905 A1 | 7/1993 |
| EP | 1215734 A2 | 6/2002 |
| GB | 2207803 A | 2/1989 |

OTHER PUBLICATIONS

French Search Report and Written Opinion dated Jun. 7, 2011from related French Application No. 10/61208.
French Search Report and Written Opinion dated Jun. 7, 2011from related French Application No. 10/61213.
French Search Report and Written Opinion dated Jul. 22, 2011 from corresponding French Application No. 10/61212.

* cited by examiner

*Primary Examiner* — Yu-Hsi D Sun
(74) *Attorney, Agent, or Firm* — Wolf, Greenfield & Sacks, P.C.

(57) ABSTRACT

A mesa-type bidirectional Shockley diode including a substrate of a first conductivity type; a layer of the second conductivity type on each side of the substrate; a region of the first conductivity type in each of the layers of the second conductivity type; a buried region of the first conductivity type under each of said regions of the first conductivity type, each buried region being complementary in projection with the other; and a groove arranged in the vicinity of the periphery of the component on each of its surfaces, the component portion external to the groove comprising, under the external portion of the upper and lower regions of the second conductivity type, regions of the first conductivity type of same doping profile as said buried regions.

20 Claims, 2 Drawing Sheets

BIDIRECTIONAL SHOCKLEY DIODE WITH EXTENDED MESA

CROSS REFERENCE TO RELATED APPLICATIONS

This application claims the priority benefit of French patent application number 10/61212, filed on Dec. 23, 2010, entitled BIDIRECTIONAL SHOCKLEY DIODE WITH EXTENDED MESA, which is hereby incorporated by reference to the maximum extent allowable by law.

BACKGROUND

1. Technical Field

Embodiments relate to components of protection against overvoltages, and more specifically to a bidirectional Shockley diode.

Two main types of bidirectional Shockley diodes can be distinguished according to the technology used for their manufacturing: planar diodes and mesa diodes.

2. Discussion of the Related Art

FIG. 1 shows an example of a planar-type bidirectional Shockley diode. This device is formed in a lightly-doped N-type substrate 1 (with typically from $10^{14}$ to $10^{15}$ atoms/$cm^3$). A P-type well 3 is formed on the upper surface side and a P-type well 5 is formed on the lower surface side. Usually, these wells are symmetrical and of same doping.

An N-type region 7 is formed in upper well 3 and an N-type region 9 is formed in lower well 5, regions 7 and 9 being heavily doped. Regions 7 and 9 are complementary in projection and substantially of same surface area. As shown, regions 7 and 9 are generally interrupted by emitter short-circuits.

The component periphery, between the well limit and the chip edge, is coated with an insulating layer, respectively 11 at its upper surface and 13 at its lower surface. Also at the periphery of the structure, at the edge of the chip, heavily-doped N-type rings, respectively 15 at the upper surface and 16 at the lower surface, are used as a channel stop.

The upper surface is coated with a metallization A1 and the lower surface is coated with a metallization A2. When a positive voltage is applied on terminal A1, PNPN Shockley diode 3-1-5-9 is likely to turn on, when the breakdown voltage of the reverse junction between regions 1 and 5 is exceeded. When a positive voltage is applied to terminal A2, PNPN Shockley diode 5-1-3-7 is likely to turn on when the breakdown voltage of the reverse junction between regions 1 and 3 is exceeded.

To obtain a breakdown voltage predetermined independently from the substrate doping and accurately define the volume of the breakdown areas, an N region 17 is arranged in front of upper N region 7 at the interface between well 3 and substrate 1 and an N region 19 is arranged in front of lower N region 9 at the interface between well 5 and substrate 1. N regions 17 and 19 will be called buried regions and, for example, result from implantations performed before the forming of P wells 3 and 5. Thus, junction J2 between N region 17 and P well 3 and junction J1 between P well 5 and N region 19 determine the breakdown voltages of the device. Optional P-type buried regions 21 and 23 have further been shown in front of N-type buried regions 19 and 17, respectively. Buried regions 21 and 23 aim at decreasing the effective thickness of substrate 1 in each of the Shockley diodes, to decrease the on-state resistance of the protection device.

A bidirectional Shockley diode of planar type such as shown in FIG. 1 provides satisfactory results.

However, in many cases, it is preferred for technological reasons to form mesa-type diodes, especially because it is much simpler to form relatively deep P regions (more than 30 μm deep for diodes adapted to breakdown voltages ranging from 50 to 400 V) with no masking.

FIG. 2 shows an example of a mesa-type bidirectional Shockley diode. To simplify the description, layers similar to that in FIG. 1 have been designated with the same reference numerals. An essential difference is that, instead of forming local P-type wells on either side of the substrate, uniform P-type layers 3 and 5, also designated with reference numerals 3 and 5, are formed with no masking on both surfaces of the substrate. The diode is delimited by peripheral grooves, respectively 31 on the upper surface side and 33 on the lower surface side, filled with an appropriate insulating material, respectively 35 and 37, currently a glassivation. Grooves cut the junctions between the substrate and P layers 3, 5. The diodes of a same wafer are separated from one another by sawing in the middle of a groove.

Generally, as compared with a planar-type diode, a mesa-type bidirectional Shockley diode, biased to a voltage smaller than its breakdown voltage, has greater leakage currents. Further, the leakage currents tend to increase during the lifetime of the component when it is submitted to external stress, such as a lengthy biasing and a high temperature. In FIG. 2, equipotential line VA2 when a positive potential difference (VA2−VA1) is applied between electrodes A2 and A1 has been illustrated with bold dotted lines. The technology used to create the mesa groove, its specific geometric shape and the nature of the passivating materials explain the distribution of the equipotential lines at the edges of the component as well as their variation in the presence of stress. The electric field thus present at the passivation-silicon interfaces is responsible for the high leakage currents.

Many solutions and mesa-type bidirectional Shockley diode structures have been provided to overcome these disadvantages. However, many known solutions are relatively complex and require additional manufacturing steps with respect to those required for the manufacturing of a component such as that illustrated in FIG. 2.

There thus is a need for a simple mesa-type bidirectional Shockley diode with a low leakage current, steady along time.

SUMMARY

Thus, an embodiment provides a mesa-type bidirectional Shockley diode which is easy to form and which has low leakage currents, which remain steady over time.

More specifically, an embodiment aims at forming such a bidirectional Shockley diode without increasing the number of steps required to manufacture a bidirectional Shockley diode such as that in FIG. 2.

Thus, an embodiment provides a mesa-type bidirectional Shockley diode, comprising: a substrate of a first conductivity type; a layer of the second conductivity type on each side of the substrate; a region of the first conductivity type in each of the layers of the second conductivity type; a buried region of the first conductivity type under each of said regions of the first conductivity type, at the interface between the substrate and the corresponding layer of the second conductivity type, each buried region being complementary in projection with the other; and a groove arranged in the vicinity of the periphery of the component on each of its surfaces, the component portion external to the groove comprising, under the external portion of the upper and lower regions of the second conductivity type, regions of the first conductivity type of same doping profile as said buried regions.

According to an embodiment, the first conductivity type is type N and the second conductivity type is type P.

According to an embodiment, the bidirectional Shockley diode comprises buried regions of the second conductivity type, at the interfaces between layers and substrate in front of the buried regions of the first conductivity type.

The foregoing and other objects, features, and advantages will be discussed in detail in the following non-limiting description of specific embodiments in connection with the accompanying drawings.

As usual in the representation of electronic components, the various drawings are not to scale.

DETAILED DESCRIPTION

Figure 1:
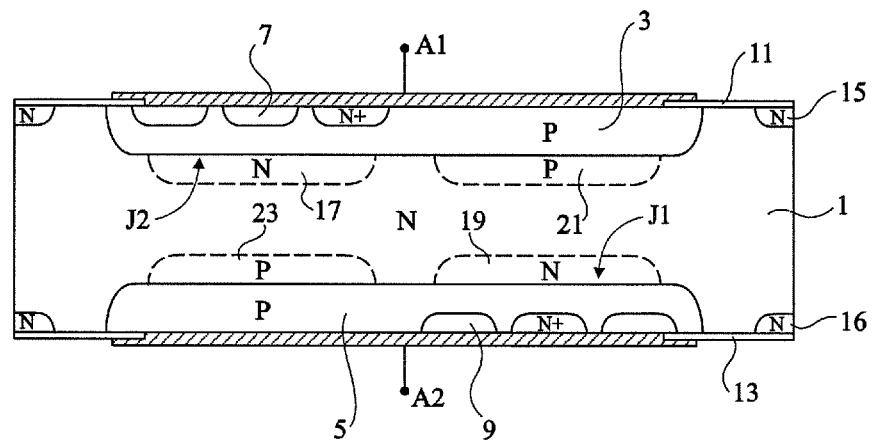
FIG. 1, previously described, is a simplified cross-section view of a planar-type bidirectional Shockley diode.
Figure 2:
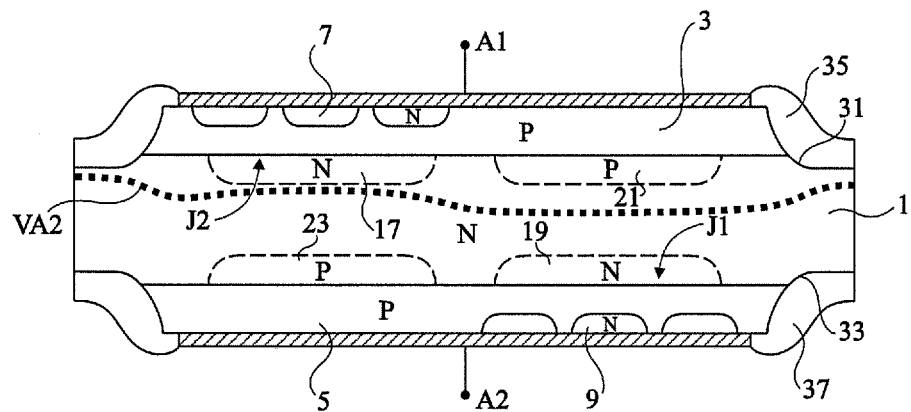
FIG. 2, previously described, is a simplified cross-section view of a mesa-type bidirectional Shockley diode.
Figure 3:
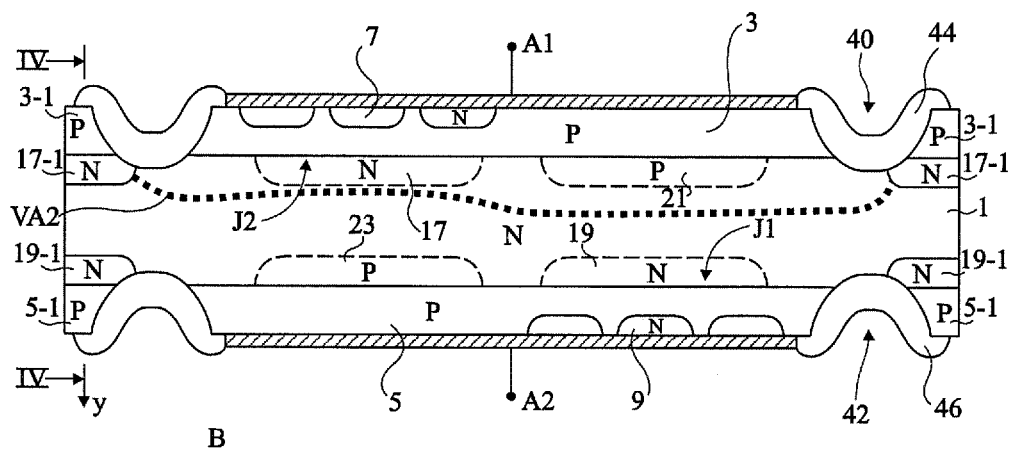
FIG. 3 is a simplified cross-section view of a bidirectional Shockley diode according to an embodiment of the present invention.

FIG. 3 is a simplified cross-section view of a bidirectional Shockley diode comprising the same elements as FIG. 2, designated with the same reference numerals. Layers 3 and 5 are formed with no masking on both sides of the structure and the other elements are formed likewise in these layers. However, this time, grooves 40, 42, filled with a glassivation 44, 46, are formed a little inside of the periphery of each component instead of being formed at the endmost periphery thereof, so that there remain unetched substrate portions beyond the groove.

In these unetched substrate portions, there thus appear, respectively on the upper surface side and on the lower surface side, portions 3-1 and 5-1 of upper and lower P layers 3 and 5. Further, at the same time as N-type buried regions 17 and 19 are formed, N-type ring-shaped buried regions 17-1 and 19-1 are formed at the component periphery, outside of grooves 40 and 42. To form ring-shaped regions 17-1, 19-1, it is sufficient to modify the mask used to delimit N-type implantations 17, 19. Thus, the structure of FIG. 3 is obtained without performing any additional operation with respect to the steps useful to the forming of the structure of FIG. 2. It should further be noted that grooves 40 and 42 of FIG. 3 may be narrower than grooves 31 and 33 of FIG. 2.

To better show the advantages of the present invention, FIGS. 2 and 3 show, in bold dotted lines, equipotential lines VA2 in the case where a positive potential difference (VA2−VA1) is applied between electrodes A2 and A1. It can be seen in FIG. 2 that, at the component periphery, under the effect of the charges inevitably present in glassivation 35, this 0 volt equipotential line tends to spread all the way to the component periphery, which favors the occurrence of leakage currents flowing vertically along this periphery.

However, in the structure of FIG. 3, equipotential line VA2 will stop at the level of N region 17-1. This equipotential line thus does not spread to the periphery and risks of occurrence of leakage currents are decreased.

Figure 4:
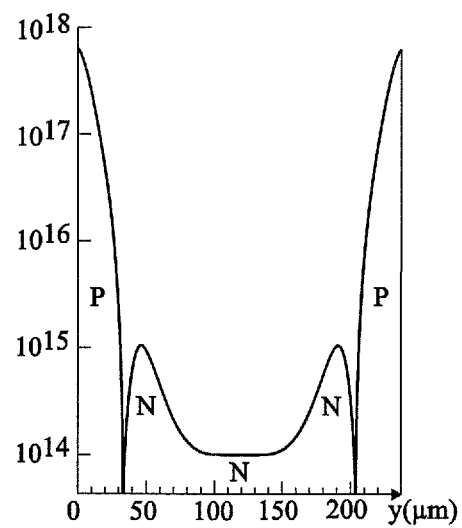
FIG. 4 is a curve indicating doping levels in direction y of plane IV-IV of FIG. 3.

FIG. 4 shows the distribution of the doping levels in direction y of plane IV-IV of FIG. 3, for a diode having a breakdown voltage on the order of 300 volts. The component has a total thickness of 240 μm, P layers 3 and 5 have 35-μm thicknesses, that is, the area taken up by the N substrate has a thickness of approximately 170 μm. It should be noted that the N-type region of substrate 1 doped with $10^{14}$ atoms/cm$^3$ is surrounded with N-type regions doped with approximately $10^{15}$ atoms/cm$^3$ which correspond to rings 17-1, 19-1 arranged at the component periphery under the glassivations. Grooves 40, 42 should have a thickness greater than the junction depth of P-type layers 3 and 5. The grooves will, for example, have a 50-μm depth.

Specific embodiments of the invention have been described. Various alterations and modifications will occur to those skilled in the art, especially as concerns the thicknesses of the various layers, and the doping levels, which will be adapted to the desired breakdown voltages which will preferably range between 50 and 400 volts.

Any known mesa-type bidirectional Shockley diode may be used, provided for N-type peripheral rings to be formed at the same time (by the same implantation) as N-type buried regions for setting the breakdown voltage.

On the other hand, a component similar to that described herein may be formed by inverting all the conductivity types of the various layers.

Such alterations, modifications, and improvements are intended to be part of this disclosure, and are intended to be within the spirit and the scope of the invention. Accordingly, the foregoing description is by way of example only and is not intended to be limiting. The present invention is limited only as defined in the following claims and the equivalents thereto.

What is claimed is:

1. A mesa-type bidirectional Shockley diode, comprising:
a substrate of a first conductivity type;
first and second layers of a second conductivity type on each side of the substrate;
regions of the first conductivity type in each of the first and second layers of the second conductivity type;
first buried regions of the first conductivity type vertically adjacent to each of said regions of the first conductivity type and located at interfaces between the substrate and the first and second layers of the second conductivity type;
first and second grooves arranged in the vicinity of the periphery of the diode on each of its surfaces, the grooves penetrating into the substrate; and
an external portion of the diode external to the grooves comprising, adjacent to the first and second layers of the second conductivity type on each side of the substrate, external buried regions of the first conductivity type of a same doping profile as said first buried regions.

2. The bidirectional Shockley diode of claim 1, wherein the first conductivity type is type N and the second conductivity type is type P.

3. The bidirectional Shockley diode of claim 1, further comprising buried second regions of the second conductivity type extending into the substrate at the interfaces between the first and second layers and the substrate.

4. The bidirectional Shockley diode of claim 1, wherein the first and second grooves are covered with an insulation layer.

5. The bidirectional Shockley diode of claim 4, wherein the external buried regions extend farther into the substrate than the insulation layer.

6. The bidirectional Shockley diode of claim 1, wherein a dopant concentration of the first buried regions and the external buried regions is approximately an order of magnitude higher than a dopant concentration of the substrate.

7. The bidirectional Shockley diode of claim 1, wherein under bias an equipotential line extending across the substrate of the diode terminates in the external buried regions.

8. The bidirectional Shockley diode of claim 1, wherein a dopant concentration of the first and second layers is approximately four orders of magnitude higher than a dopant concentration of the substrate.

9. The bidirectional Shockley diode of claim 1, wherein the first and second layers are approximately 35 microns thick and the external buried regions are approximately 40 microns thick.

10. The bidirectional Shockley diode of claim 1, configured to provide a breakdown voltage in a range between 50 volts and 400 volts.

11. A bidirectional Shockley diode comprising:
a substrate of a first conductivity type;
a first layer of a second conductivity type at a first side of the substrate and a second layer of the second conductivity type at a second side of the substrate;
a first groove at the first side of the substrate and a second groove at the second side of the substrate, each groove extending into the substrate and extending around the diode inside of a periphery of the diode; and
an external portion of the diode outside of the first and second grooves, wherein the external portion includes a first external buried region of the first conductivity type at the first side of the substrate extending from the first layer of the second conductivity type into the substrate.

12. The bidirectional Shockley diode of claim 11, wherein the first and second grooves are covered with an insulator and the first external buried region extends into the substrate beyond the first groove.

13. The bidirectional Shockley diode of claim 11, further comprising a first interior buried region of the first conductivity type at an interior region of the diode extending from the first layer of the second conductivity type into the substrate.

14. The bidirectional Shockley diode of claim 13, wherein the first external buried region and the first interior buried region have a same first dopant profile.

15. The bidirectional Shockley diode of claim 14, wherein a dopant concentration of the first external buried region and the first interior buried region is approximately an order of magnitude greater than a dopant concentration of the substrate.

16. The bidirectional Shockley diode of claim 13, wherein a dopant concentration of the first and second layers of the second conductivity type is approximately three orders of magnitude greater than a dopant concentration of the substrate.

17. The bidirectional Shockley diode of claim 13, further comprising electrical contacts on each side of the substrate configured to provide external electrical connection to the first and second layers of the second conductivity type.

18. The bidirectional Shockley diode of claim 17, further comprising wells of the first conductivity type formed within the first layer of the second conductivity type at the interior region of the diode and physically contacting the electrical contacts.

19. The bidirectional Shockley diode of claim 18, wherein the wells of the first conductivity type are vertically adjacent to the first interior buried region of the first conductivity type.

20. The bidirectional Shockley diode of claim 17, further comprising a well of the second conductivity type formed at the interior region of the diode and extending from the first layer of the second conductivity type into the substrate.

* * * * *